United States Patent
Chang et al.

(10) Patent No.: US 11,114,153 B2
(45) Date of Patent: Sep. 7, 2021

(54) SRAM DEVICES WITH REDUCED COUPLING CAPACITANCE

(71) Applicant: Taiwan Semiconductor Manufacturing Co., Ltd., Hsinchu (TW)

(72) Inventors: Chao-Yuan Chang, Hsinchu (TW); Kian-Long Lim, Hsinchu (TW); Jui-Lin Chen, Taipei (TW); Feng-Ming Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/730,376

(22) Filed: Dec. 30, 2019

(65) Prior Publication Data
US 2021/0217467 A1    Jul. 15, 2021

(51) Int. Cl.
*G11C 11/412* (2006.01)
*G11C 11/419* (2006.01)
*H01L 27/11* (2006.01)

(52) U.S. Cl.
CPC .......... *G11C 11/412* (2013.01); *G11C 11/419* (2013.01); *H01L 27/1104* (2013.01); *H01L 27/1116* (2013.01)

(58) Field of Classification Search
CPC . G11C 11/412; G11C 11/419; H01L 27/1116; H01L 27/1104
USPC ........................................... 365/154, 230.06
See application file for complete search history.

(56) References Cited

U.S. PATENT DOCUMENTS

| | | | |
|---|---|---|---|
| 10,948,453 B2 * | 3/2021 | Garner | G01N 27/4148 |
| 2005/0161716 A1 * | 7/2005 | Matsuura | H01L 21/02178 257/295 |
| 2006/0268600 A1 | 11/2006 | Kasko | |
| 2007/0228431 A1 * | 10/2007 | Wang | H01L 27/11507 257/295 |
| 2008/0073680 A1 * | 3/2008 | Wang | H01L 27/11507 257/295 |
| 2008/0136990 A1 * | 6/2008 | Kimura | G02F 1/136286 349/46 |
| 2010/0193849 A1 * | 8/2010 | Nishimura | H01L 28/55 257/295 |
| 2011/0241077 A1 * | 10/2011 | Lung | H01L 27/0688 257/208 |
| 2012/0063201 A1 * | 3/2012 | Hayakawa | H01L 45/1625 365/148 |

(Continued)

FOREIGN PATENT DOCUMENTS

| | | |
|---|---|---|
| DE | 10 2016 114 698 A1 | 6/2017 |
| KR | 101373918 B1 | 3/2014 |
| KR | 20190076707 A | 7/2019 |

*Primary Examiner* — Michael T Tran
(74) *Attorney, Agent, or Firm* — Seed IP Law Group LLP

(57) ABSTRACT

The current disclosure is directed to a SRAM bit cell having a reduced coupling capacitance. In a vertical direction, a wordline "WL" and a bitline "BL" of the SRAM cell are stacked further away from one another to reduce the coupling capacitance between the WL and the BL. In an embodiment, the WL is vertically spaced apart from the BL with one or more metallization level that none of the WL or the BL is formed from. Connection island structures or jumper structures are provided to connect the upper one of the WL or the BL to the transistors of the SRAM cell.

20 Claims, 13 Drawing Sheets

(56) References Cited

U.S. PATENT DOCUMENTS

| | | | |
|---|---|---|---|
| 2012/0265474 A1* | 10/2012 | Rearick | G16B 30/00 702/104 |
| 2012/0295413 A1* | 11/2012 | Fujii | H01L 27/101 438/382 |
| 2014/0104918 A1* | 4/2014 | Castro | H01L 27/2436 365/63 |
| 2014/0110802 A1* | 4/2014 | Berger | H01L 23/5226 257/421 |
| 2014/0138599 A1* | 5/2014 | Fujii | H01L 27/2409 257/2 |
| 2014/0197368 A1* | 7/2014 | Yoneda | H01L 45/08 257/2 |
| 2016/0329488 A1 | 11/2016 | Li et al. | |
| 2018/0308541 A1 | 10/2018 | Liaw | |
| 2019/0066751 A1* | 2/2019 | Matsubara | H01L 27/11502 |
| 2019/0123061 A1* | 4/2019 | Liu | G11C 11/2273 |
| 2019/0214558 A1* | 7/2019 | Ando | H01L 45/10 |
| 2019/0304988 A1* | 10/2019 | Dong | H01L 29/40111 |
| 2020/0279598 A1* | 9/2020 | Jiang | G11C 11/2255 |
| 2020/0381446 A1* | 12/2020 | Choi | H01L 27/11556 |

* cited by examiner

SRAM DEVICES WITH REDUCED COUPLING CAPACITANCE

BACKGROUND

Static random access memory ("SRAM") arrays provide storage without the need for refresh cycles. SRAM arrays generally require more silicon area than a dynamic random access memory ("DRAM") since each bit cell is a latch typically formed of six transistors (6T) or more. However, the SRAM cells will retain data so long as an adequate supply voltage is present. Further, SRAM is advantageous because the access time is faster than that of DRAM, making SRAM cells particularly attractive as scratchpad or working data storage, such as cache memory for processors. System on a chip ("SOC") designs often incorporate one or more processing "cores". These processor cores are designed for various data processing purposes and are often each arranged with a level one cache memory of SRAM cells laid out near or adjacent to the respective processor cores. Such dedicated SRAM cells make very fast processor operations possible.

To meet the demand in portable electronics and high speed computation, it is desirable to integrate more data storage cells including cross-coupled invertors into a single SRAM chip and to lower power consumption thereof. For example, fin field-effect transistors ("FinFET") are used to achieve SRAMs with smaller size and lower power consumption.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
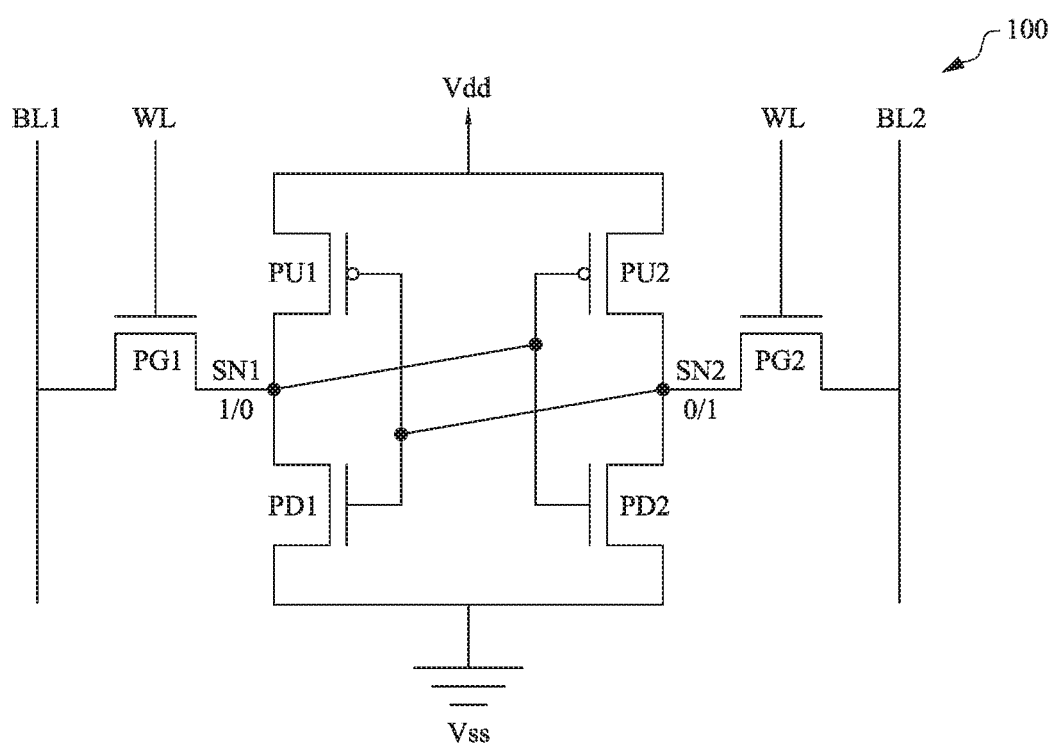
FIG. 1 is a circuitry diagram of an example SRAM cell according to example embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A mixed transistor type SRAM bit cell having a reduced coupling capacitance is provided. In a vertical direction, a wordline "WL" and a bitline "BL" of the SRAM cell are stacked further away from one another to reduce the coupling capacitance between the WL and the BL. In an embodiment, one of the BL or the WL, e.g., the WL, is vertically spaced apart from the other one of the BL or the WL, e.g., the BL, with one or more metallization level that none of the WL or the BL is formed from. That is, the metallization level of the WL, referred to as "WL metal level" for descriptive purposes, and the metallization level of the BL, referred to as "BL metal level" for descriptive purposes, are vertically spaced apart from one another by at least one additional metallization level in-between. In an embodiment, one or more metal island structures, referred to as "jumper structures," are formed within the additional metallization level and are connected to the upper one of the WL or the BL. The jumper structures each do not overlap with the lower one of the WL or the BL, such that the coupling capacitance between a jumper structure and the lower one of the WL or the BL is minimized, if any. The distance between the WL and the BL is substantially increased so that the coupling capacitance between the WL and the BL is substantially reduced. To this extent, the width of the WL may be increased to lower the resistance. The size of the jumper structures are optimally configured to maintain a determined balance between minimizing coupling capacitance and minimizing resistance in the connection path between the WL and the gates of the transistors that is connected to the WL.

FIG. 1 is an example SRAM bit cell 100 in a six transistor ("6T") arrangement. In FIG. 1, a pair of MOS pass gates PG1 and PG2 are each coupled to one of a pair of data lines referred to as "bitlines" BL1, BL2 to inversely related storage nodes SN1 and SN2, respectively. In an embodiment, the pass gate transistors PG1 and PG2 are formed of NMOS transistors. A first voltage node $V_{dd}$ may provide a voltage ranging from about 0.6 Volts to about 3.0 Volts, depending on the technology node. Pull up transistors PU1, PU2 are each formed of PMOS transistors and coupled between the first supply node $V_{dd}$ and one of the storage nodes SN1, SN2, depending on the state of the SRAM cell 100.

A second voltage $V_{ss}$ may provide a voltage potential lower than the first voltage node $V_{dd}$, e.g., set as a ground. Two pull down transistors PD1, PD2 are each formed of NMOS transistors, and are coupled between the second voltage node $V_{ss}$ and one of the storage nodes SN1, SN2, depending on the state of the SRAM cell 100. The 6T SRAM bit cell 100 is a latch that will retain its data state indefinitely so long as the supplied power \Tad is sufficient to operate the circuit correctly. Two CMOS inverters formed of PU1, PD1 and PU2, PD2 are "cross coupled" and they operate to reinforce the stored charge on the storage nodes SN1, SN2 continuously. The two storage nodes SN1, SN2 are inverted from one another, as shown in FIG. 1. When the SN1 is at a high voltage level, e.g., logical "1", the SN2 is at a low voltage level, e.g., logical "0", and vice versa.

When the SRAM bit cell 100 is written to, complementary write data signals are placed on the bitline pair BL1 and BL2. A positive control signal on a wordline WL is coupled to the gate of the pass gates PG1, PG2. The transistors PU1, PD1 and PU2, PD2 are sized in a manner that the data on the bitlines BL1, BL2 may overwrite the stored data and thus write, or program, the SRAM bit cell 100.

When the SRAM bit cell 100 is read from, a positive voltage is placed on the wordline WL, and the pass gates PG1 and PG2 allow the bitlines BL1 and BL2 to be coupled to receive the data from the storage nodes SN1 and SN2, respectively. Unlike a dynamic memory cell, the SRAM bit cell 100 does not lose its stored state during a read operation if the power supply $V_{dd}$ is maintained at a sufficiently high level.

Figure 2:
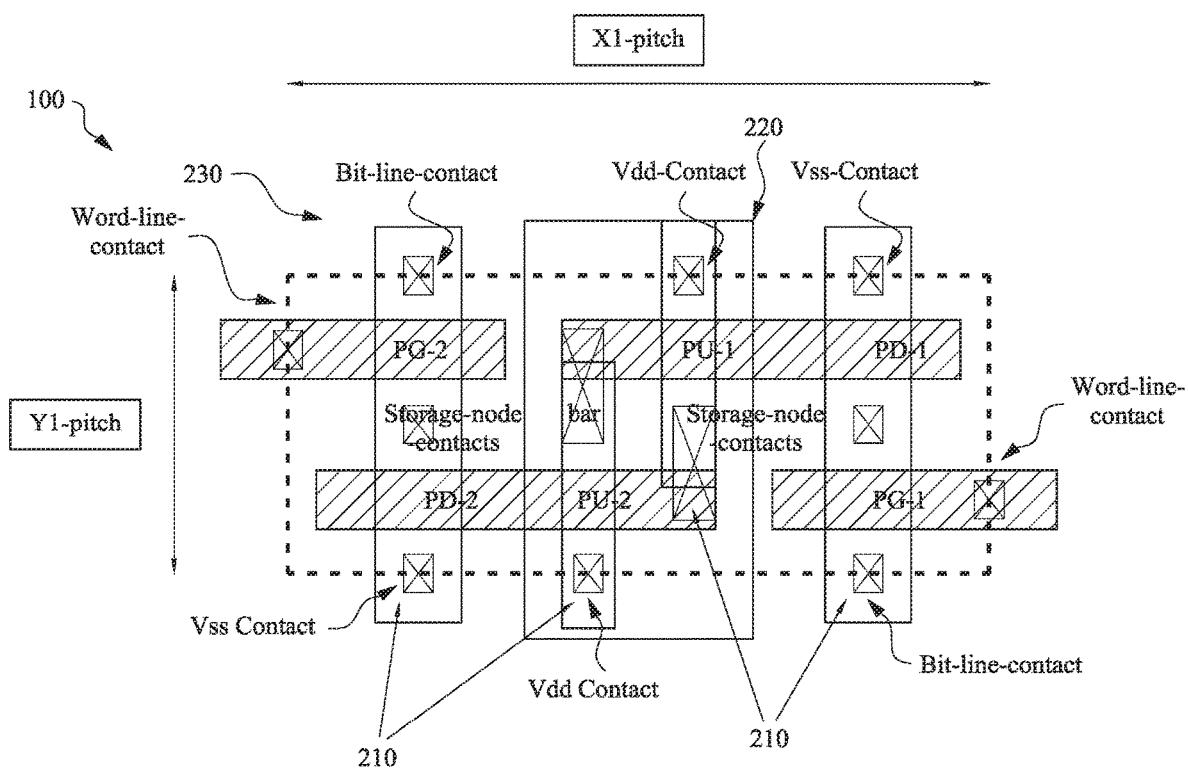
FIG. 2 is an example layout view of the example SRAM cell of FIG. 1.

FIG. 2 is an example bit cell layout, in an X-Y plane, of the single port, 6T bit cell 100. In FIG. 2, the dashed areas depict the gate structures. The gate structures are positioned over semiconductor areas/structures 210. The transistors PG-1, PG-2, PU-1, PU-2, PD-1, and PD-2 are labeled at their respective gate structures. The cell 100 has a pitch labeled Y1-pitch in the Y direction and a pitch labeled X1-pitch in the X direction. Example contacts are shown with "X" for illustration purposes and are labeled with the appropriate signal. Wordline WL contacts are formed to the gates of the PG-1, PG-2 transistors. Bitline contacts are formed to the source/drain terminals of the PG-1, PG-2 transistors. Power $V_{dd}$, $V_{ss}$ contacts are formed to the source/drain terminals of the PU-1, PU-2, PD-1, PD-2 transistors. Storage node contacts are formed to the storage nodes SN1 and SN2, respectively. The pull-up transistors PU-1, PU-2 are different types of transistors than the pull-down transistors PD-1, PD-2. In an example embodiment, as shown in FIG. 2, the pull-up transistors PU-1, PU-2 are formed in a doped region, e.g., an N type well 220, within a P type substrate 230, where the pull-down transistors are formed in. Other example embodiments, e.g., a dual-well configuration, are also possible and within the scope of the disclosure.

In an embodiment, the semiconductor structures 210 are fin-shaped semiconductor structures and gate structures each wrap around the respective fin-shaped semiconductor structures 210.

Figure 3A:
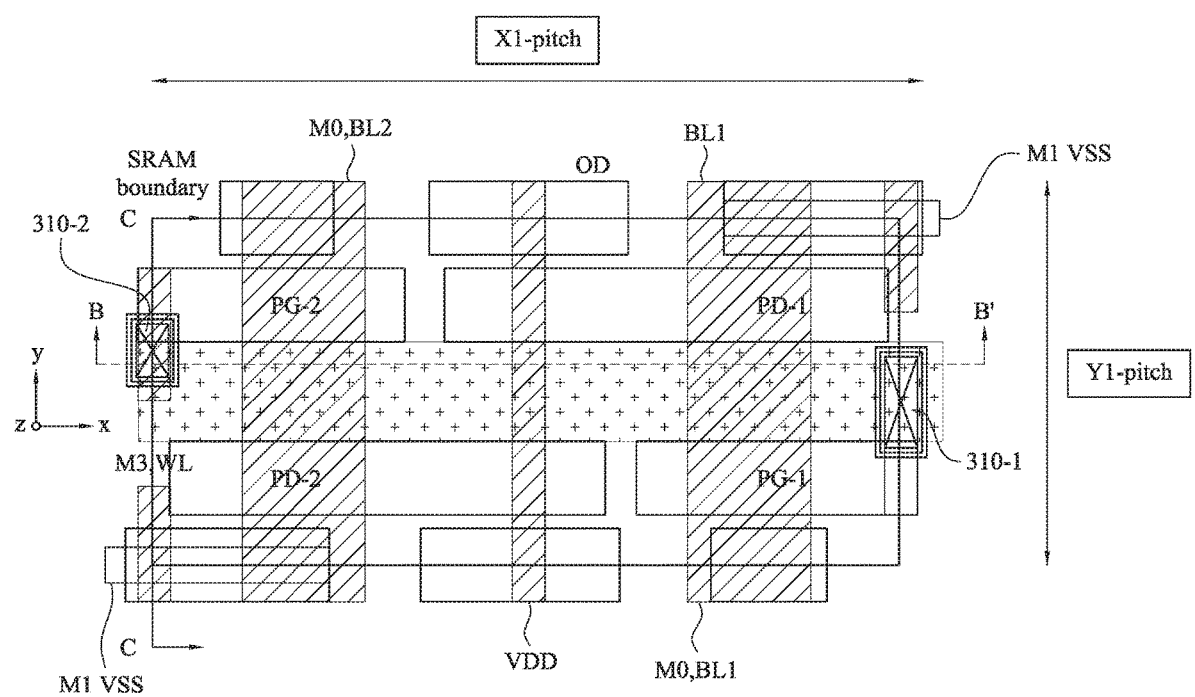
FIGS. 3A-3C show signal lines of the example SRAM cell of FIGS. 1-2 in BEOL metallization structures.
Figure 3B:
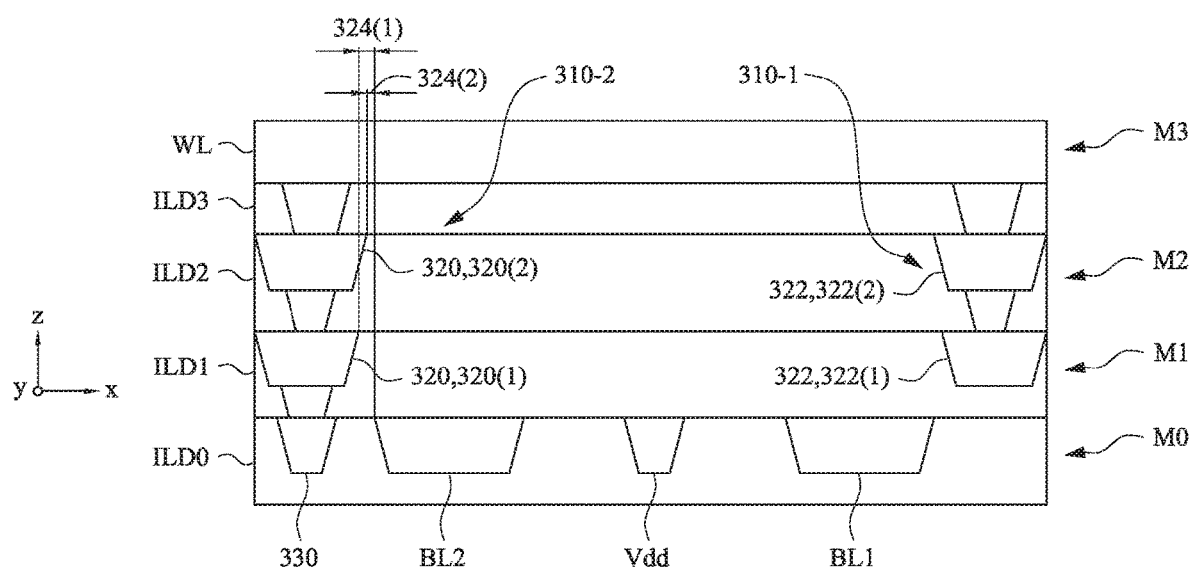
Figure 3C:
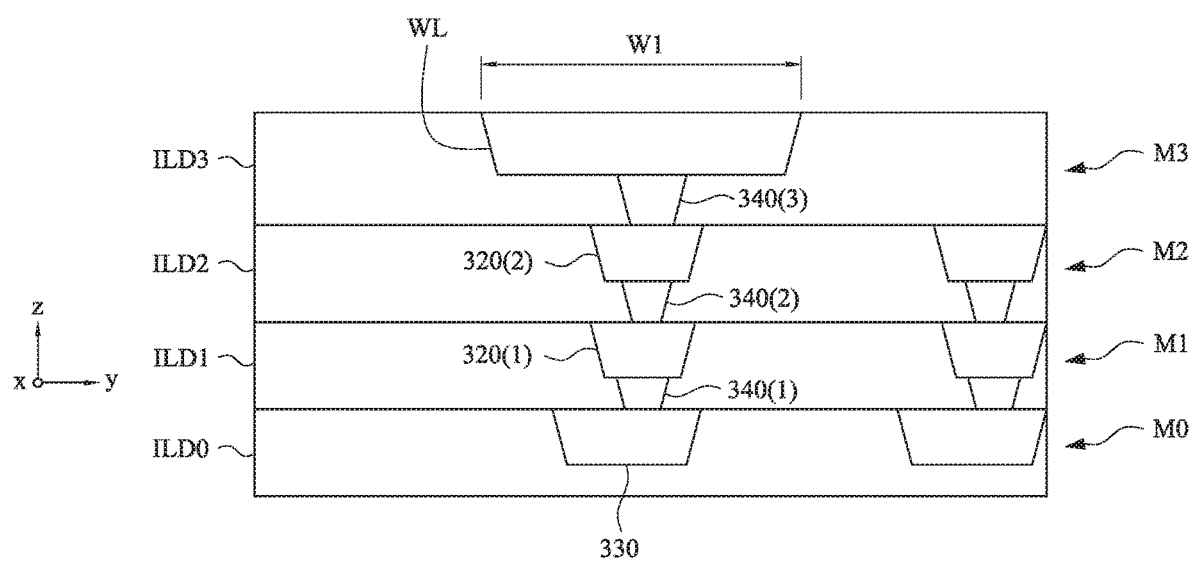

FIG. 3A-3C show a structure 300 including the example bit cell 100 and metal lines of the wordline WL and the bitlines BL1, BL2, the first power supply $V_{dd}$, and the second power supply $V_{ss}$. FIG. 3A is a layout view in the X-Y plane. FIG. 3B is a cross-sectional view of the metallization levels of the structure 300 from cutting line BB. FIG. 3C is a cross-sectional view of the metallization levels of the structure 300 from cutting line CC.

As shown in FIGS. 3A-3C, the bitlines BL1, BL2 are metal lines formed as a part of a lower level metallization, referred to as "M0" for descriptive purposes, within a lower level inter-layer dielectric "ILD" layer ILD0. The BL1, BL2 metal lines may be longitudinal and are oriented along the y-axis direction in the X-Y plane.

The wordline WL is a metal line formed as a part of an upper level metallization M3, within an upper level ILD, ILD3. The WL metal line may be longitudinal and is oriented along the x-axis direction that is orthogonal to the y-axis direction.

There are at least one inter-layer dielectric layers, shown as two ILD 1, ILD2, positioned vertically between the ILD0 and the ILD3. The ILD0 is also referred to as BL level for descriptive purposes, and the ILD3 is also referred to as WL level for descriptive purposes. The ILD2, ILD1 that are positioned vertically between the BL level ILD0 and the WL level ILD3 are also referred to as "jumper ILD" for descriptive purposes. In some embodiments, the jumper ILD layers are added to increase the distance between the wordline WL and the bitlines BL1, BL2. The numerals "0" is used as an example to indicate a lower level of ILD and a lower level of metallization, with respect to ILD3 or metallization level M3. That is, the ILD0 is two levels below the ILD3. "ILD0" does not necessarily indicate that the ILD is the first ILD level formed in the BEOL process or that the ILD is any specific ILD level formed in the BEOL process. Similarly, "M0" does not necessarily indicate that the metallization level is the first metallization level formed in the BEOL process or that the metallization is any specific metallization level formed in the BEOL process.

The gates of the transistors PG-1, PG-2 (not shown in FIG. 3B) are each connected to the WL through a series of interconnection features (referred to as 'interconnection assembly") 310-1, 310-2, respectively. The interconnection assembly 310-1 includes one or more jumper structures 322, shown as 322(1), 322(2) formed in jumper ILD layers ILD1, ILD2, respectively. The interconnection assembly 310-2 includes one or more jumper structures 320, shown as jumper structures 320(1), 320(2) formed in jumper ILD layers ILD1, ILD2, respectively. In an embodiment, each of the jumper structures 320, 322 does not vertically overlap with the adjacent bitlines BL1, BL2. Specifically, for example, the jumper structures 320(1), 320(2) each is spaced away from the BL2, in the x-axis, by a gap space 324(1), 324(2). The gap spaces 324(1), 324(2) ensure that the coupling capacitance, if any, between the jumper structures 320(1), 320(2) to the bitline BL2 is minimized or reduced.

As such, in an embodiment, the dimensions of each jumper structures 320, 322 in the x-axis direction are minimized subject to the minimum area rule defined by the process design. For example, the minimum area rule provides that the x-axis dimension of a jumper structure 320, 322 be sufficiently large to ensure contact or connection with a respective connection via. In an embodiment, the x-axis dimension of a jumper structure 320, 322 may be designed based on a vertical distance between the jumper structure 320, 322 and the adjacent bitline BL1, BL2. Specifically, a jumper structure 320, 322 that is positioned vertically further away from the bitline BL1, BL2, may include a larger x-axis dimension than a jumper structure 320, 322 that is positioned vertically closer to the bitline BL1, BL2. For example, the jumper structure 320(2) formed as part of the M2 metallization in the ILD2 layer may include a larger x-axis dimension than the jumper structure 320(1) formed as part of the M1 metallization in the ILD1 layer, because the jumper structure 320(2) is vertically further away from the adjacent bitline BL2. The longer distance may compensate, at least to some extent, for the increased x-axis dimension of the jumper structure 320(2), as compared to the jumper structure 320(1).

In an embodiment, the dimensions of each jumper structures 320, 322 in the y-axis direction are minimized subject to the minimum area rule defined by the process design. For example, the minimum area rule provides that the y-axis dimension of a jumper structure 320, 322 be sufficiently large to ensure contact or connection with a respective connection via. In an embodiment, the y-axis dimension of a jumper structure 320, 322 may be designed based on a vertical distance between the jumper structure 320, 322 and the adjacent bitline BL1, BL2. Specifically, a jumper structure 320, 322 that is positioned vertically further away from the bitline BL1, BL2, may include a larger y-axis dimension than a jumper structure 320, 322 that is positioned vertically closer to the bitline BL1, BL2. For example, the jumper structure 320(2) formed as part of the M2 metallization in the ILD2 layer may include a larger y-axis dimension than the jumper structure 320(1) formed as part of the M1 metallization in the ILD1 layer, because the jumper structure 320(2) is vertically further away from the adjacent bitline BL2. The longer distance may compensate, at least to some extent, for the increased y-axis dimension of the jumper structure 320(2), as compared to the jumper structure 320 (1).

In the example embodiment, the bitlines BL1, BL2 are longitudinal and oriented along the y-axis direction. That is, the increase in the y-axis dimension will not affect whether a jumper structure 320, 322 vertically overlaps with the adjacent bitline BL1, BL2. As such, in some embodiment, the y-axis dimension of a jumper structure 320, 322 is more flexibly designed as compared to the x-axis dimension thereof.

It should be noted that the surface area of a jumper structure 320, 322 may not be a rectangular shape, and may include a circular shape, an oval shape, another polygonal shape or an irregular shape. The above description of the x-axis dimension and/or the y-axis dimension of a jumper structure 320, 322 may also be similarly applied to such non-rectangular shapes.

Further, the description herein about the x-axis or y-axis dimensions of a jumper structure 320, 322 may similarly apply to a size of a surface area of a jumper structure 320, 322. For example, a size of a surface area of a jumper structure 320, 322, in the X-Y plane, may be designed based on a vertical distance between the jumper structure 320, 322 and the adjacent bitline BL1, BL2. A jumper structure 320, 322 that is positioned further away from a bitline BL1, BL2 may include a larger surface area than a jumper structure 320, 322 that is positioned closer to the bitline BL1, BL2. For example, the jumper structure 320(2) may include a larger surface area than the jumper structure 320(1) because the jumper structure 320(2) is positioned vertically further away from the adjacent bitline BL2.

The WL is connected to a connection island structure 330 as part of the M0 metallization in the ILD0 layer through the jumper structures 320, 322 and via structures 340, here 340(1), 340(2), 340(3) formed in dielectric layers ILD1, ILD2, ILD3, respectively. The descriptions about the dimension sizes and/or surface area sizes of the jumper structures 320, 322 also apply similarly to the connection via structures 340. FIG. 3 shows that the jumper structures are larger in the x-axis and y-axis dimensions than the adjacent connection via structures, which does not limit the scope of the disclosure. In some embodiment, a connection via 340 may include one of more of a larger x-axis dimension, a larger y-axis dimension or a larger X-Y plane surface area than an adjacent jumper structure 320, 322.

Figure 4A:
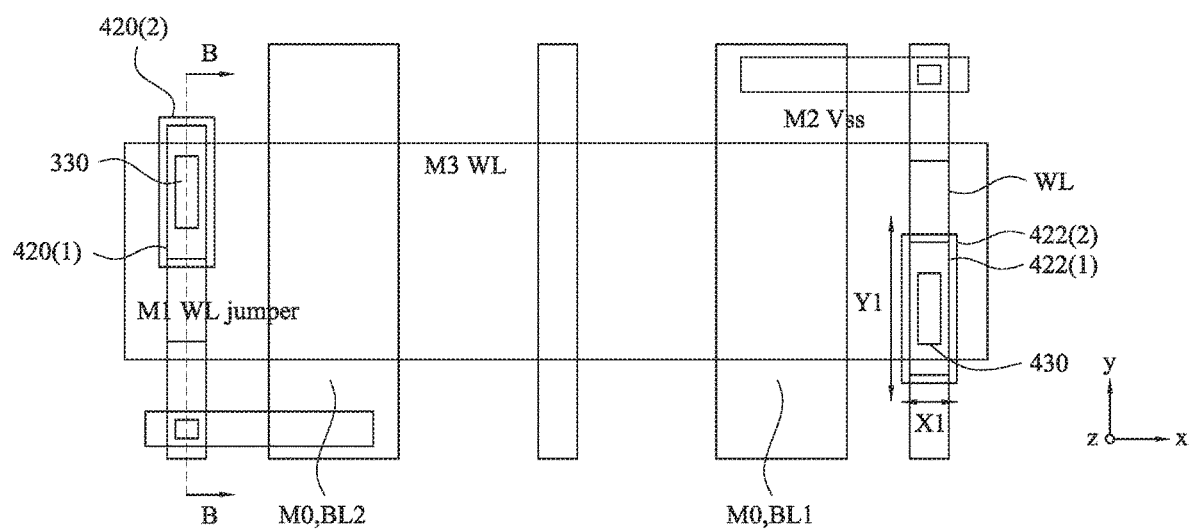
FIGS. 4A-4B show an alternative embodiment of the signal lines of the example SRAM cell of FIGS. 1-2 in BEOL metallization structures.
Figure 4B:
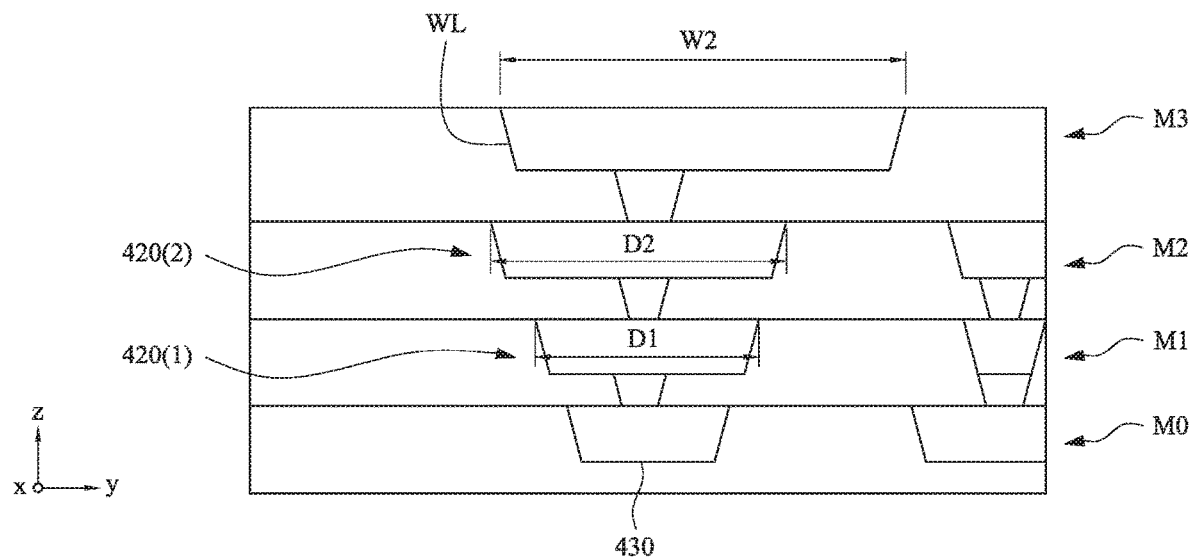

FIGS. 4A-4B show an alternative embodiment. FIG. 4A is an X-Y plane view. FIG. 4B is an Y-Z sectional view. As shown in FIGS. 4A and 4B, a wide W2 of the WL is larger than the W1 of the WL of FIGS. 3A-3C. The larger width W2 of the embodiment shown in FIGS. 4A and 4B is enabled by the reduced coupling capacitance between the wordline WL and the bitlines BL1, BL2. The X-Y plane surface areas of the jumper structures 420(2), 420(1) and the island structure 430 increase along the upward direction of the z-axis. Specifically, the X-Y plane surface area of the jumper structure 420(2) is larger than the X-Y plane surface area of the jumper structure 420(1). The X-Y plane surface area of the jumper structure 420(1) is larger than the X-Y plane surface area of the island structure 430. In an embodiment, the surface area ratios among the island structure 430, the jumper structure 420(1), and the jumper structure 420(2) are between about 1:1.1:1.15 to about 1:1.3:1.4. In an embodiment, the jumper structures 420(1), 420(2) include substantially a same dimension in the x-axis to avoid overlapping with the adjacent bitline BL2, while the jumper structure 420(2) includes a larger dimension in the y-axis than the jumper structure 420(1). That is, the surface area ratios between or among the island structure 430, the jumper structure 420(1), and the jumper structure 420(2) mainly attribute to the variations in the y-axis dimensions thereof.

In an embodiment, none of the jumper structure 420 (420(1), 420(2) shown), 422 (422(1), 422(2) shown) of FIGS. 4A, 4B overlaps vertically with the adjacent bitline BL2, BL1, respectively. The surface e area of the jumper structure 420(1) that is positioned in the ILD1 immediately over the M1 metallization of the bitlines BL1, BL2 is designed to have minimized X-Y plane surface area subject to minimum area design rules like the via enclosure rule and the minimum area rule for the jumper structure.

Similar to the surface areas, the x-axis or y-axis dimensions of the of the island structure 430, the jumper structure 420(1), and the jumper structure 420(2) may also increase along upward direction of the z-axis. Specifically, the x-axis dimension of the jumper structure 420(2) is larger than the x-axis dimension of the jumper structure 420(1). The x-axis dimension of the jumper structure 420(1) is larger than the x-axis dimension of the island structure 430. Specifically, the y-axis dimension of the jumper structure 420(2) is larger than the y-axis dimension of the jumper structure 420(1). The y-axis dimension of the jumper structure 420(1) is larger than the y-axis dimension of the island structure 430.

The metallization levels M0, M1, M2, M3 may be one or more of copper, gold, silver, aluminum, cobalt, tungsten or other suitable conductive materials. The ILD layers ILD0, ILD1, ILD2, ILD3 are silicon oxide, silicon nitride, low-k dielectric materials, or other suitable dielectric materials.

The wordline WL is vertically spaced away from the bitlines BL1, BL2 by at least one jumper ILD layer that none of the WL or the BL1, BL2 are formed within. As such the coupling capacitances between the WL and the BL1, BL2 are reduced. The width or the surface area of wordline WL may be increased to reduce signal line resistance. The surface areas of the jumper structures may be balanced between reducing coupling capacitance between the jumper structures and the adjacent bitline and reducing interconnection line resistance. A jumper structure positioned vertically closer to the adjacent bitline may include a minimized dimension and surface area while a jumper structure positioned vertically further away from the adjacent bitline may include a larger dimension and/or surface area. As such, the coupling capacitance and the signal line resistance may be optimized in a balancing manner. The signal transmittal delay time could be reduced substantially.

In the description herein, for simplicity purposes, the dielectric layer surrounding each metallization levels M1, M2, M3 and the dielectric layer surrounding the respective interconnect structures 340(1), 340(2), 340(3) formed immediately below the respective metallization levels M1, M2, M3 are described as one ILD layer. Specifically, for example, ILD1 surrounds both the M1 level including the jumper structure 320(1) and the via structure 340(1); ILD2 surrounds both the M2 level including the jumper structure 320(2) and the via structure 340(2); and ILD3 surrounds both the M3 level including the wordline WL and the via structure 340(3). It should be appreciated that depending on the specific process of forming the via structures 340(1), 340(2), 340(3), the dielectric layer surrounding a via structure 340(1), 340(2), 340(3) may be separate from a dielectric layer surrounding the metallization level M1, M2, M3 that is formed immediately above the respective via structures 340(1), 340(2), 340(3). That is, each of the ILD1, ILD2, ILD3 in the description herein may include two or more dielectric layers.

Figure 5:
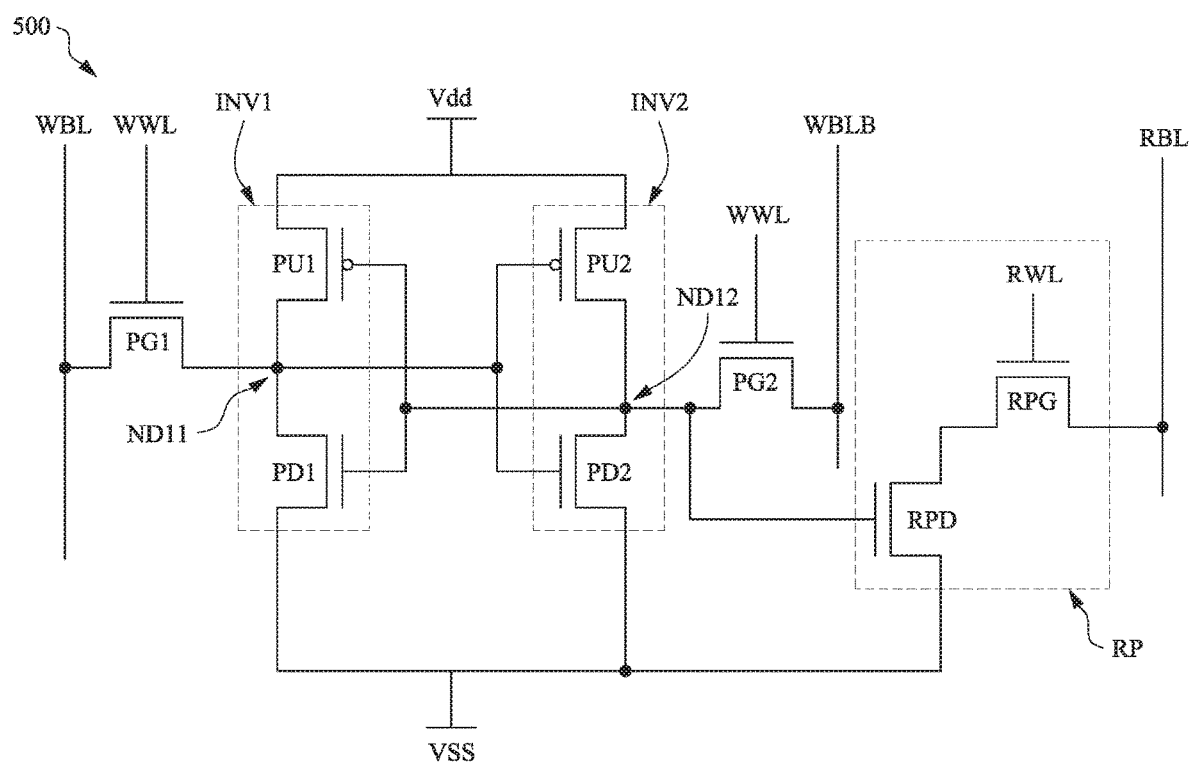
FIG. 5 is a circuitry diagram of another example SRAM cell according to example embodiments of the disclosure.

In the description of FIGS. 1-4B, a 6T SRAM cell is used as an illustrative example. The disclosed techniques are not limited to 6T SRAM and may include other SRAM cell design and/or other types of memory cells. For example, FIG. 5 is an example 8T SRAM design. Referring to FIG. 5, an 8T SRAM cell 500 includes a first pull-up transistor PU1 and a first pull-down transistor PD1 forming a first inverter INV1, a second pull-up transistor PU2 and a second pull-down transistor PD2 forming a second inverter INV2. The first inverter INV1 and the second inverter INV2 are cross-coupled to one another and are coupled to write bitlines WBL, WBLB, through first and second pass-gate transistors PG1 and PG2, configured to write data to be stored by the cross-coupled first and second inverters INV1 and INV2, respectively. A read pull-down transistor RPD and a read pass-gate transistor RPG forms a read port RP to access data stored by the cross-coupled first and second inverters INV1 and INV2.

Specifically, drain electrodes of the first pull-up transistor PU1, the first pull-down transistor PD1, and the first pass-gate transistor PG1 are electrically connected at a first data storage node ND11. Drain electrodes of the second pull-up transistor PU2, the second pull-down transistor PD2, and the second pass-gate transistor PG2 are electrically connected at a second data storage node ND12.

Gate electrodes of the second pull-up transistor PU2 and the second pull-down transistor PD2 are electrically connected to the drain electrodes of the first pull-down transistor PD1, the first pass-gate transistor PG1, and the first pull-up transistor PU1 through the first data storage node ND11, while gate electrodes of the first pull-up transistor PU1 and the first pull-down transistor PD1 are electrically connected to the drain electrodes of the second pull-down transistor PD2, the second pass-gate transistor PG2, and the second pull-up transistor PU2 through the second data storage node ND12.

Source electrodes of the first and second pull-down transistors PD1 and PD2 are connected to a first power supply node Vss, while source electrodes of the first and second pull-up transistors PU1 and PU2 are connected to a second power supply node Vdd. According to one embodiment, the first power supply node Vss is electrically connected to a ground, and the second power supply node Vdd is electrically connected to a positive electrical potential, supplied from a power supply circuit (not shown) of the SRAM.

Gate electrodes of the first and second pass-gate transistors PG1 and PG2 are connected to a write wordline WWL. Source electrodes of the first and second pass-gate transistors PG1 and PG2 are connected to first and second write bitlines WBL and WBLB, respectively.

The read pass-gate transistor RPG and the read pull-down transistor RPD are connected in series between a read bitline RBL and the first power supply node Vss. The read pull-down transistor RPD has a gate electrode electrically connected to the second data storage node ND12. A gate electrode of the read pass-gate transistor RPG is connected to a read wordline RWL configured to control reading of the data stored by the cross-coupled first and second inverters INV1 and INV2 by way of the conduction state of the read pull-down transistor RPD to the read bitline RBL.

The wordlines WL and the paired bitlines BL1, BL2 are vertically spaced apart by at least one jumper ILD layer other than the ILD layer ILD3 of the wordline or ILD layer ILD0 of the paired bitline. For example, the write wordline WWL may be formed on metallization level M3 of FIG. 3 while the first and second write bitlines WBL, WBLB are formed on the metallization level M0 that is separated from the metallization level M3 by two metallization levels M1, M2. The read wordline RWL is also formed in a metallization level at least two levels away from a metallization level of the read bitline RBL. That is, there is at least one additional metallization level vertically positioned between the metallization level of the RWL and the metallization level of RBL.

Figure 6:
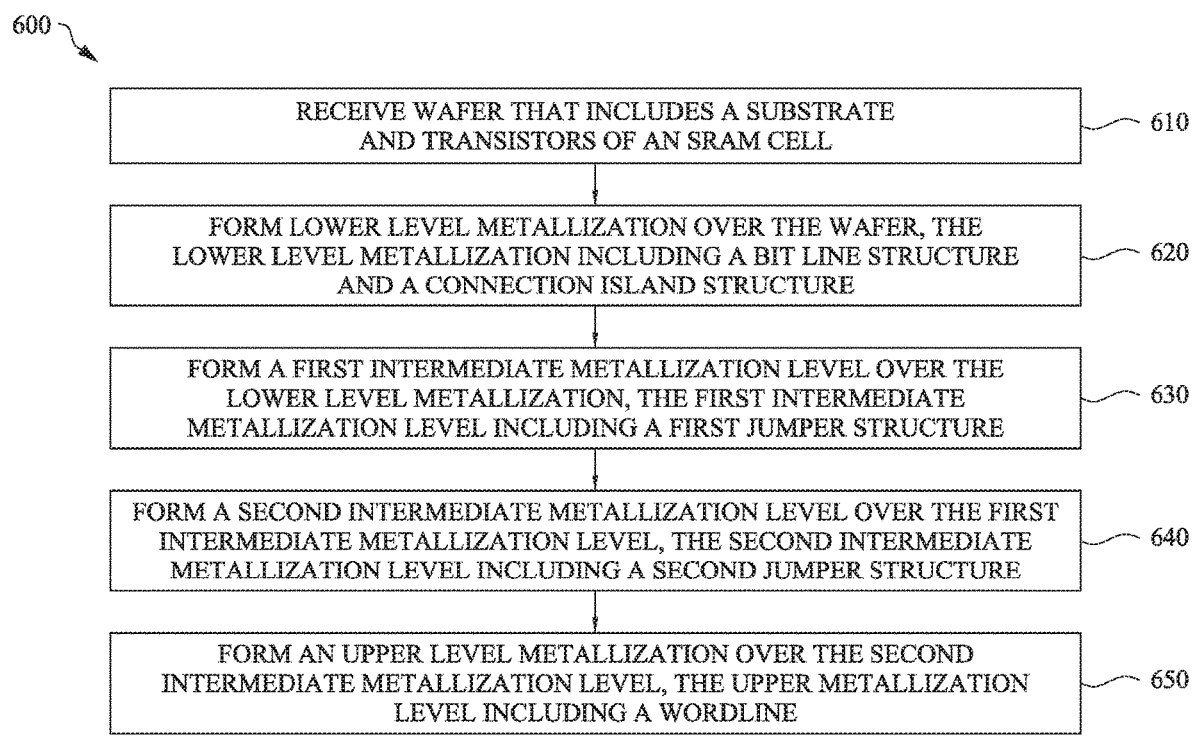
FIG. 6 is a flow diagram of an example process according to example embodiments of the disclosure.

FIG. 6 is an example process of making among others. FIGS. 7-11 show a wafer 700 in various stages of fabrication under the example process of FIG. 6.

Figure 7:
FIGS. 7-11 are views of a wafer in various stages of fabrication according to the example process of FIG. 6.

Referring to FIG. 6, with reference also to FIG. 7, in example operation 610, a wafer 700 is received. The wafer 700 includes a substrate 702 and an FEOL layer 704 formed over the substrate 702. In some embodiments, the FEOL layer 704 includes the transistors of an SRAM cell, e.g., the 6T SRAM cell of FIG. 1 or the 8T SRAM cell of FIG. 5. In an embodiment, the wafer 700 has completed the front-end-of-line device fabrication process which forms transistors over the substrate 702.

The wafer 700 may also have completed the middle-end-of-line process, which forms the pre-metal dielectric layer ("PMD") and the contact structures, e.g., vias, that directly contacts the terminals of transistors, e.g., the gates and the source/drain structures of FET transistors.

Figure 8:
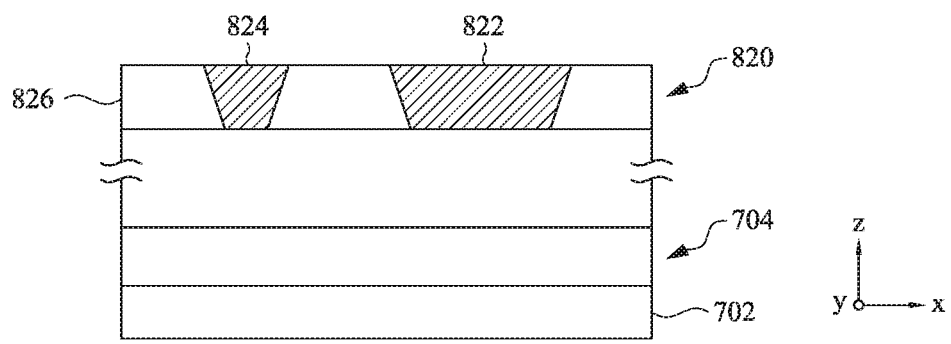

In example operation 620, with reference also to FIG. 8, a lower level metallization 820 is formed over the wafer 700. The lower level metallization 820 may include a bit line structure 822 and a connection island structure 824. The bit line structure 822 and the island 824 may each connect to a respective interconnect structure, e.g., a via, to connect to respective terminals of the transistors in the IC block 704, which are omitted for simplicity purposes. For example, the bitline structure 822 is ultimately connected to a source/drain terminal of a transistor and the island 824 is ultimately connected to a gate of the same transistor. The lower level metallization 820 may be the first metallization level formed over the pre-metal dielectric layer "PMD" or may be any metallization level over the first metallization level. The metallization level 820 is formed in a dielectric layer 826.

Figure 9:
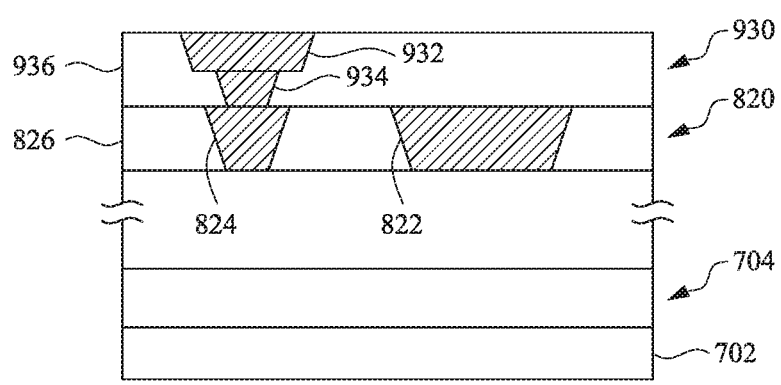

In example operation 630, with reference also to FIG. 9, a first intermediate metallization level 930 is formed over the dielectric layer 826 and the metallization level 820. The metallization level 930 includes a jumper structure 932. The jumper structure 932 is connected to the island structure 824 through an interconnect structure 934. The jumper structure 932 and the interconnect structure 934 are formed in a dielectric layer 936. The jumper structure 932 and the interconnect structure 934 each do not overlap with the bitline structure 822 in the vertical direction, here the z-axis direction. The dielectric layer 936 may be formed by a thin film process, e.g., a CVD or a PVD process or other suitable thin film process. The metallization level 930 may be blankly formed over a wafer surface and then patterned to obtain the jumper structure 932. The jumper structure 932 may also be formed using other metal deposition and patterning processes like a damascene process or a lift-off process. The interconnect structure 934 is a metal structure formed using a damascene process or a lift-off process.

Figure 10:
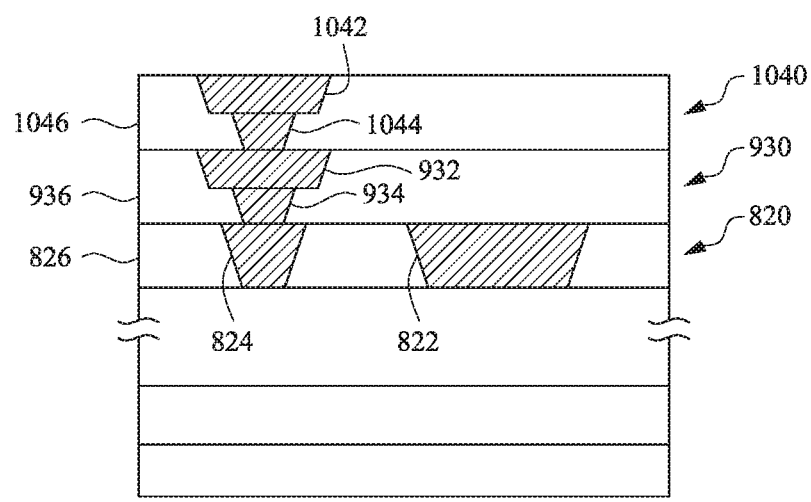

In example operation 640, with reference also to FIG. 10, a second intermediate metallization level 1040 is formed over the dielectric layer 936 and the metallization level 930. The metallization level 1040 includes a jumper structure 1042. The jumper structure 1042 is connected to the jumper structure 932 through an interconnect structure 1044. The jumper structure 1042 and the interconnect structure 1044 are formed in a dielectric layer 1046. The jumper structure 1042 and the interconnect structure 1044 each do not overlap with the bitline structure 822 in the vertical direction, here the z-axis direction.

Figure 11:
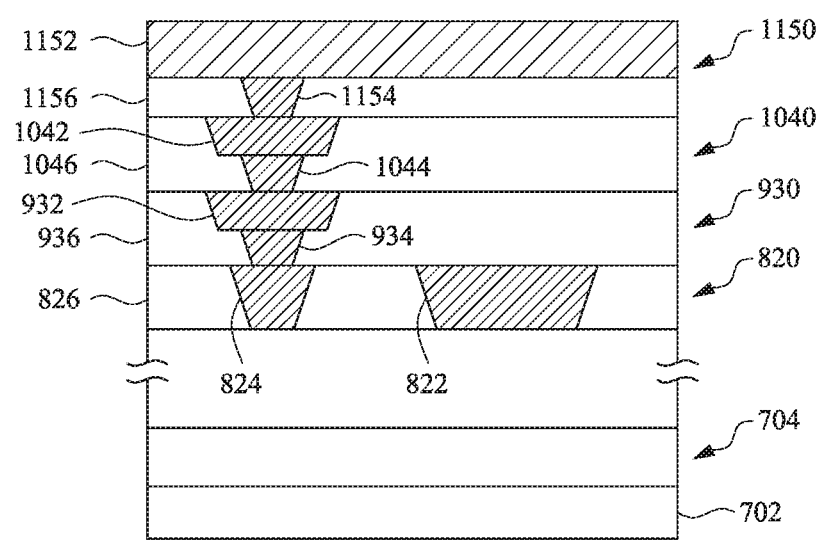

In example operation 650, with reference also to FIG. 11, an upper metallization level 1150 is formed over the dielectric layer 1046 and the metallization level 1040. The metallization level 1150 includes a wordline structure 1152. The wordline structure 1152 is connected to the jumper structure 1042 through an interconnect structure 1154. The wordline structure 1152 and the interconnect structure 1154 are formed in a dielectric layer 1156. The interconnect structure 1154 does not overlap with the bitline structure 822 in the vertical direction, here the z-axis direction. Through the jumper structures 1042, 932 and the island 824, the wordline structure 1152 is ultimately connected to the gate of the transistor. The wordline structure 1152, although overlapping with the bitline structure 822, is vertically spaced apart from the bitline structure 822 by at least one metallization level that none of the wordline structure 1152 or the bitline structure 822 is formed from. The increased vertical distance between the wordline structure 1152 and the bitline structure 822 reduces coupling capacitance between the wordline structure 1152 and the bitline structure 822 when both are supplied with electrical signals.

In some embodiments, the method 600 may be used to fabricate the SRAM cells 100, 500 or other SRAM cells. For example, the wordline structure 1152 of FIG. 11 may be configured as the wordline WL of FIG. 3. The jumper structures 932, 1042 may be configured as the jumper structures 320(1), 320(2) of FIG. 3. The island structure 824 may be configured as the connection island structure 330 of FIG. 3. The bit line structure 822 may be configured as the second bitline BL2 of FIG. 3.

In the description herein, a FET transistor is used as an illustrative example to describe the example SRAM memory cells, e.g., the 6T SRAM cell of FIG. 1 and the 8T SRAM cell of FIG. 5. It should be noted that other type of transistors, e.g., a bipolar transistor, may also be used to form a SRAM cell, which are all included in the disclosure.

In the description herein, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims herein, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

A finFET or gate all around (GAA) structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the finFET or GAA structure.

The present disclosure may be further appreciated with the description of the following embodiments:

In a structure embodiment, a structure includes a substrate and a first transistor of a memory cell formed over the substrate. The first transistor includes a first terminal and a second terminal. A first metallization level is formed over the first transistor. The first metallization level includes a first metal line structure and a metal island structure separated from the first metal line structure. The first metal line structure is longitudinal oriented along a first lateral direction and is connected to the first terminal of the first transistor. The metal island structure is connected to the second terminal of the first transistor. A second metallization level is formed over the first metallization level. The second metallization level includes a first metal jumper structure. The first metal jumper structure is connected to the metal island structure and is positioned non-overlapping with the first metal line structure. A third metallization level is formed over the second metallization level. The third metallization level includes a second metal line structure. The second metal line structure is longitudinal oriented along a second lateral direction that is different from the first lateral direction. The second metal line structure is connected to the first metal jumper structure.

In another embodiment, a memory device includes a substrate and a pass gate transistor over the substrate. The pass gate transistor includes a first terminal and a second terminal. A first signal line is positioned in a first metallization level over the first transistor. The first signal line is connected to the first terminal of the pass gate transistor. A metal island structure is positioned in the first metallization level. The metal island structure is laterally separated from the first signal line. A second signal line is positioned in a second metallization level vertically separated from the first metallization level by at least a third metallization level vertically positioned between the first metallization level and the second metallization level. A first metal jumper structure is positioned in the third metallization level. The first metal jumper structure is connected to both the second signal line and the metal island structure.

In a method embodiment, a method includes forming a first metallization level over a wafer. The wafer includes a first transistor of a memory cell over a substrate. The first transistor includes a first terminal and a second terminal. The first metallization level includes a first metal line structure and a metal island structure laterally separated from the first metal line structure. The first metal line structure is longitudinal oriented along a first lateral direction and is connected to the first terminal of the first transistor. The metal island structure is connected to the second terminal of the first transistor. A second metallization level is formed over the first metallization level. The second metallization level includes a first metal jumper structure. The first metal jumper structure is connected to the metal island structure and is positioned non-overlapping with the first metal line structure. A third metallization level is formed over the second metallization level. The third metallization level includes a second metal line structure. The second metal line structure is longitudinal oriented along a second lateral direction that is different from the first lateral direction. The second metal line structure is connected to the first metal jumper structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A structure, comprising:
   a substrate;
   a first transistor of a memory cell formed over the substrate, the first transistor including a first terminal and a second terminal;
   a first metallization level over the first transistor, the first metallization level including a first metal line structure and a metal island structure separated from the first metal line structure, the first metal line structure being longitudinal oriented along a first lateral direction and being connected to the first terminal of the first transistor, the metal island structure being connected to the second terminal of the first transistor;
   a second metallization level over the first metallization level, the second metallization level including a first metal jumper structure, the first metal jumper structure being connected to the metal island structure and being positioned non-overlapping with the first metal line structure; and
   a third metallization level over the second metallization level, the third metallization level including a second metal line structure, the second metal line structure being longitudinal oriented along a second lateral direction that is different from the first lateral direction, the second metal line structure being connected to the first metal jumper structure.

2. The structure of claim 1, wherein the second lateral direction is substantially orthogonal with the first lateral direction.

3. The structure of claim 1, wherein the first metal jumper structure is connected to the metal island structure through at least a first interconnect structure directly below the first metal jumper structure.

4. The structure of claim 3, wherein the first interconnect structure is non-overlapping with the first metal line structure.

5. The structure of claim 3, further comprising a fourth metallization level positioned vertically between the second metallization level and the third metallization level, the fourth metallization level including a second metal jumper structure connected to the first metal jumper structure, the second metal jumper structure including a larger surface area in a lateral plane than the first metal jumper structure.

6. The structure of claim 5, wherein the second metal jumper structure includes a larger dimension in the first lateral direction than the first metal jumper structure, while including a substantially same dimension in the second lateral direction as the first metal jumper structure.

7. The structure of claim 5, wherein the second metal jumper structure is connected to the first metal jumper structure at least through a second interconnect structure positioned directly below the second metal jumper structure.

8. The structure of claim 7, wherein the second interconnect structure includes a larger surface area in the lateral plane than the first interconnect structure.

9. The structure of claim 8, wherein the first interconnect structure and the second interconnect structure each does not overlap with the first metal line structure.

10. The structure of claim 1, wherein the first metal jumper structure includes a larger surface area in a lateral plane than the metal island structure.

11. A memory device, comprising:
    a substrate;
    a pass gate transistor over the substrate, the pass gate transistor including a first terminal and a second terminal;
    a first signal line positioned in a first metallization level over the pass gate transistor, the first signal line being connected to the first terminal of the pass gate transistor;
    a metal island structure in the first metallization level, the metal island structure being laterally separated from the first signal line;
    a second signal line positioned in a second metallization level;
    a third metallization level vertically positioned between the first metallization level and the second metallization level; and
    a first metal jumper structure in the third metallization level, the first metal jumper structure being connected to both the second signal line and the metal island structure.

12. The memory device of claim 11, wherein the first metal jumper structure does not overlap with the first signal line.

13. The memory device of claim 11, wherein the first metal jumper structure includes a larger surface area in a lateral plane than the metal island structure.

14. The memory device of claim 11, wherein the first metal jumper structure is connected to the metal island structure through a first interconnect structure, the first interconnect structure being non-overlapping with the first signal line.

15. The memory device of claim 14, wherein the first signal line is longitudinal along a first lateral direction, and wherein a dimension of the first metal jumper structure in a second lateral direction that is orthogonal to the first lateral direction is minimized subject to a threshold determined based on a size of the first interconnect structure.

16. The memory device of claim 14, wherein the first signal line is longitudinal along a first lateral direction, and wherein a dimension of the first metal jumper structure in the first lateral direction is larger than a dimension of the metal island structure in the first lateral direction.

17. A method, comprising:
forming a first metallization level over a wafer, the wafer including a first transistor of a memory cell over a substrate, the first transistor including a first terminal and a second terminal, the first metallization level including a first metal line structure and a metal island structure laterally separated from the first metal line structure, the first metal line structure being longitudinal oriented along a first lateral direction and being connected to the first terminal of the first transistor, the metal island structure being connected to the second terminal of the first transistor;

forming a second metallization level over the first metallization level, the second metallization level including a first metal jumper structure, the first metal jumper structure being connected to the metal island structure and being positioned non-overlapping with the first metal line structure; and forming a third metallization level over the second metallization level, the third metallization level including a second metal line structure, the second metal line structure being longitudinal oriented along a second lateral direction that is different from the first lateral direction, the second metal line structure being connected to the first metal jumper structure.

18. The method of claim 17, wherein the first metal jumper structure is formed to be connected to the metal island structure through at least a first interconnect structure directly below the first metal jumper structure.

19. The method of claim 18, wherein the first interconnect structure is positioned without overlapping with the first metal line structure.

20. The method of claim 17, further comprising forming a fourth metallization level after the forming the second metallization level and before the forming the third metallization level, the fourth metallization level including a second metal jumper structure connected to the first metal jumper structure, the second metal jumper structure including a larger surface area in a lateral plane than the first metal jumper structure.

* * * * *